United States Patent
Meyer et al.

(10) Patent No.: US 6,568,944 B1
(45) Date of Patent: May 27, 2003

(54) CIRCUIT BOARD WITH INCREASED EDGE CONNECTION CAPACITY

(75) Inventors: Charles S. Meyer, Nevada City, CA (US); Robert W. Hudelson, Grass Valley, CA (US); Scott A. Matheson, Nevada City, CA (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 163 days.

(21) Appl. No.: 09/790,365

(22) Filed: Feb. 21, 2001

(51) Int. Cl.[7] .......................... H01R 12/00; H05K 1/00
(52) U.S. Cl. .................................................. 439/79
(58) Field of Search ....................... 439/59–65, 66–85, 439/74–79, 374–379, 626, 630–632

(56) References Cited

U.S. PATENT DOCUMENTS

| | | | | |
|---|---|---|---|---|
| 4,838,798 A | * | 6/1989 | Evans et al. .................... 439/61 |
| 4,906,197 A | * | 3/1990 | Noll ............................... 439/79 |
| 5,203,004 A | * | 4/1993 | Bunton et al. ................. 395/800 |
| 5,224,019 A | * | 6/1993 | Wong et al. ................... 361/393 |
| 5,785,533 A | * | 7/1998 | Baitz et al. ..................... 439/61 |
| 5,822,197 A | * | 10/1998 | Thuault ......................... 361/803 |
| 5,907,475 A | * | 5/1999 | Babinski et al. ............... 361/719 |
| 5,921,802 A | * | 7/1999 | Reiswig et al. ................ 439/374 |
| 5,967,803 A | * | 10/1999 | Ho | |

OTHER PUBLICATIONS

Stab Gibilisco, The Illustrated Dictionary of Electronics, McGraw–Hill, p. 79.*

* cited by examiner

Primary Examiner—Renee Luebke
Assistant Examiner—Larisa Tsukerman
(74) Attorney, Agent, or Firm—Merchant & Gould P.C.

(57) ABSTRACT

Electronic equipment includes a frame having a wall and connectors attached to the wall of the frame. A main board has a connection edge at which it is provided with connectors for engaging the connectors that are attached to the wall of the frame when the main board is advanced relative to the frame along a connection axis. An edge connector receptacle is attached to the wall of the frame and defines a slot perpendicular to the connection axis and to the connection edge of the main board. An auxiliary board is attached to the main board and is oriented perpendicular to the main board and parallel to the connection axis. The auxiliary board has a connection edge perpendicular to the connection edge of the main board and positioned to enter the slot of the edge connector receptacle concurrently with engagement of the connectors at the connection edge of the main board with the connectors attached to the wall of the frame.

7 Claims, 2 Drawing Sheets

CIRCUIT BOARD WITH INCREASED EDGE CONNECTION CAPACITY

CROSS-REFERENCE TO RELATED APPLICATION

Certain subject matter disclosed in this application is related to subject matter disclosed in copending application Ser. No. 09/790,309 filed Feb. 21, 2001, the entire disclosure of which is hereby incorporated by reference herein for all purposes.

BACKGROUND OF THE INVENTION

This invention relates to a circuit board structure with increased edge connection capacity.

It is common practice to make electrical connections between circuitry on a printed circuit board and a power supply or an external signal source or signal destination by mechanically engaging a connection edge of the board with a mating receptacle and simultaneously establishing electrically conductive connections between an electrically conductive structure at the connection edge of the board and a complementary electrically conductive structure incorporated in the receptacle and including contacts that are electrically connected to the power supply or to the signal source or destination, as the case may be. In one conventional case, the receptacle and electrically conductive structure incorporated therein is known as a card edge connector and the conductive structure at the connection edge of the circuit board is a printed pattern of conductive strips. It is possible to provide connections at a density as high as 38 pins per inch of circuit board edge with this type of connection scheme.

It is not always convenient or desirable to employ a card edge connector for connecting circuitry on a printed circuit board with circuitry off the circuit board, and in some cases it may be necessary or desirable to employ coaxial connectors, such as the connectors that are commonly known as BNC connectors. For example, in one application where BNC receptacles are provided in a backplane assembly of a mounting frame and it is necessary to provide electrical connection between the BNC receptacles and circuitry on a circuit board that slides into the frame, it has been found desirable to provide BNC receptacles along the connection edge of the circuit board and to implement the BNC receptacle in the backplane assembly with the female portion of a male/female BNC feed through. When the circuit board is installed in the frame, a receptacle on the connection edge of the board engages the male portion of the feed through.

When BNC receptacles are used in this manner, the minimum center-to-center spacing of the receptacles is about 0.625 inches and accordingly the maximum density of signal paths that can be provided along the connection edge of the circuit board is much less than in the case of the other conventional scheme mentioned above. If in order to maximize the number of signal paths, the maximum number of BNC receptacles are mounted to the circuit board at its connection edge, there is little space for other connections, for example for power lines and control signals.

SUMMARY OF THE INVENTION

In accordance with a first aspect of the invention there is provided electronic equipment comprising a frame including a wall and connectors attached to the wall of the frame, a main board having a connection edge at which it is provided with connectors for engaging the connectors that are attached to the wall of the frame when the main board is advanced relative to the frame along a connection axis, an edge connector receptacle attached to the wall of the frame and defining a slot perpendicular to the connection axis and to the connection edge of the main board, and an auxiliary board attached to the main board and oriented perpendicular to the main board and parallel to the connection axis and having a connection edge perpendicular to the connection edge of the main board, the auxiliary board being positioned to enter the slot of the edge connector receptacle concurrently with engagement of the connectors at the connection edge of the main board with the connectors attached to the wall of the frame.

In accordance with a second aspect of the invention there is provided electronic equipment comprising a frame including a wall and connectors attached to the wall of the frame, a main board having a connection edge at which it is provided with connectors for engaging the connectors that are attached to the wall of the frame when the main board is advanced relative to the frame along a connection axis, first and second edge connector receptacles attached to the wall of the frame and each defining a slot perpendicular to the connection axis and to the connection edge of the main board, the connectors that are attached to the frame being between the first and second edge connector receptacles, and first and second auxiliary boards attached to the main board and each oriented perpendicular to the main board and parallel to the connection axis and having a connection edge perpendicular to the connection edge of the main board, the first and second auxiliary boards being positioned to enter the slots of the first and second edge connector receptacles respectively, concurrently with engagement of the connectors at the connection edge of the main board with the connectors attached to the wall of the frame.

BRIEF DESCRIPTION OF THE DRAWINGS

For a better understanding of the invention, and to show how the same may be carried into effect, reference will now be made, by way of example, to the accompanying drawings, in which.

DETAILED DESCRIPTION

Figure 1:
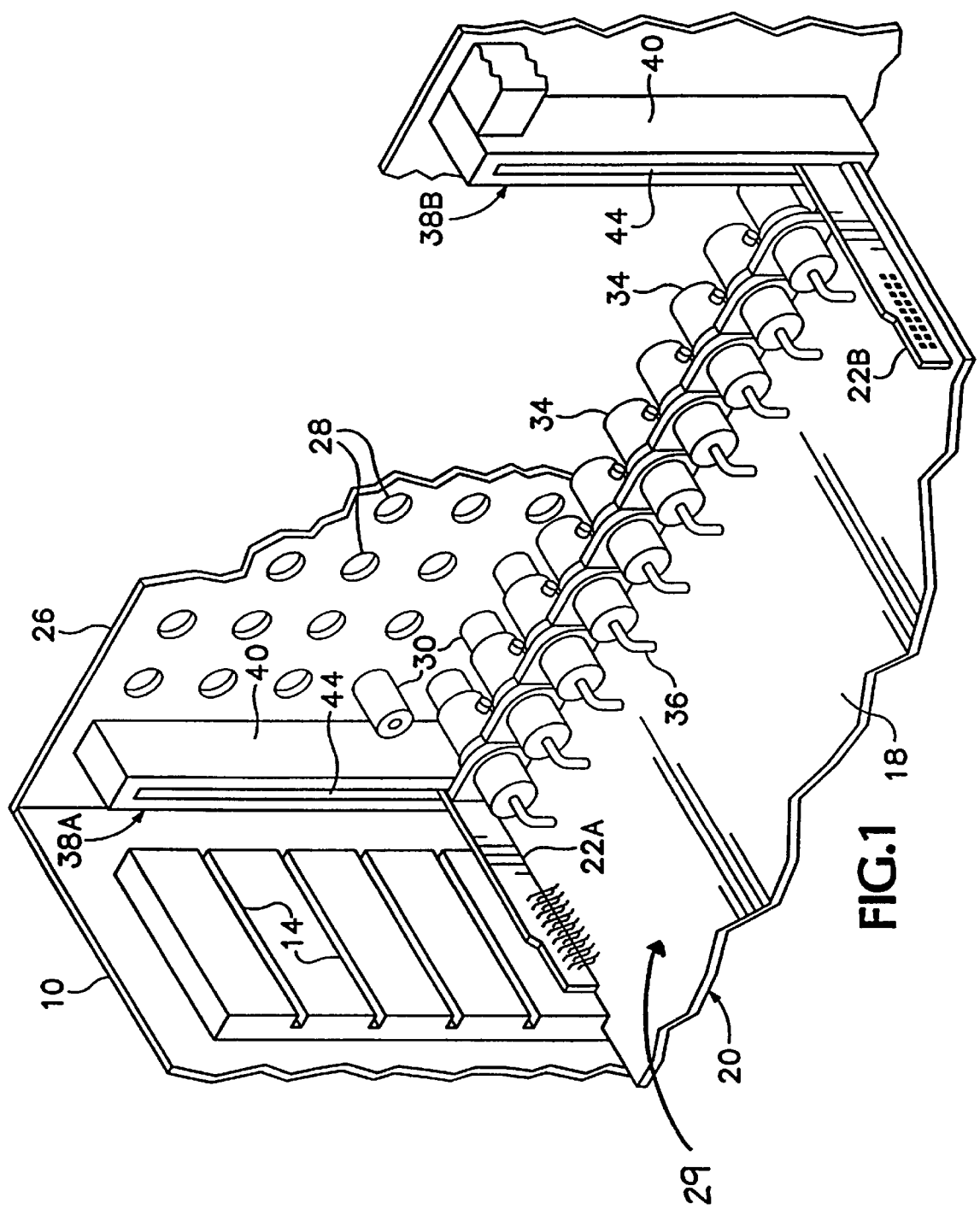
FIG. 1 is a partial perspective view of an item of electronic equipment in accordance with the present invention and illustrates a circuit board assembly including a main board and two auxiliary boards.
Figure 2:
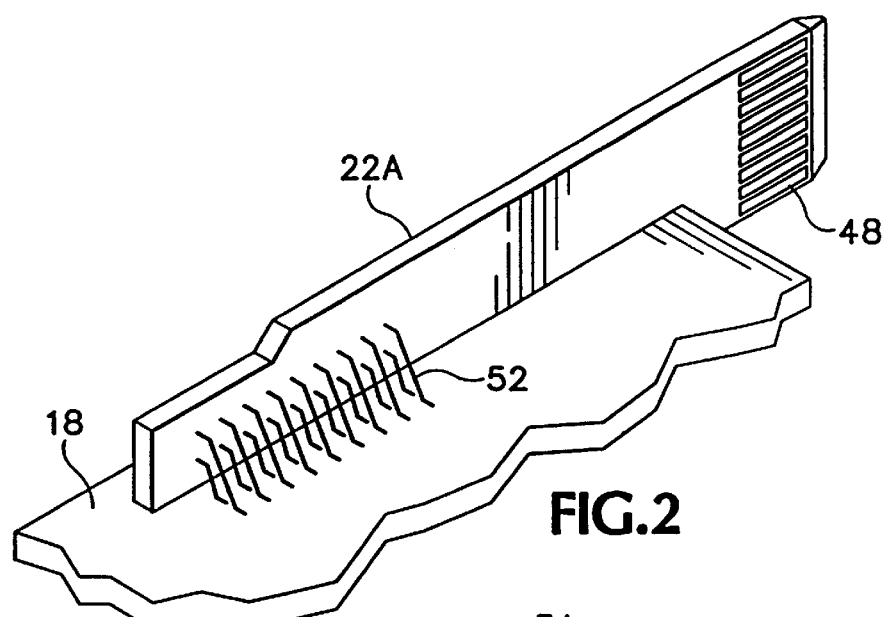
FIG. 2 is an enlarged perspective view of a detail of the circuit board assembly at one end of its connection edge.
Figure 3:
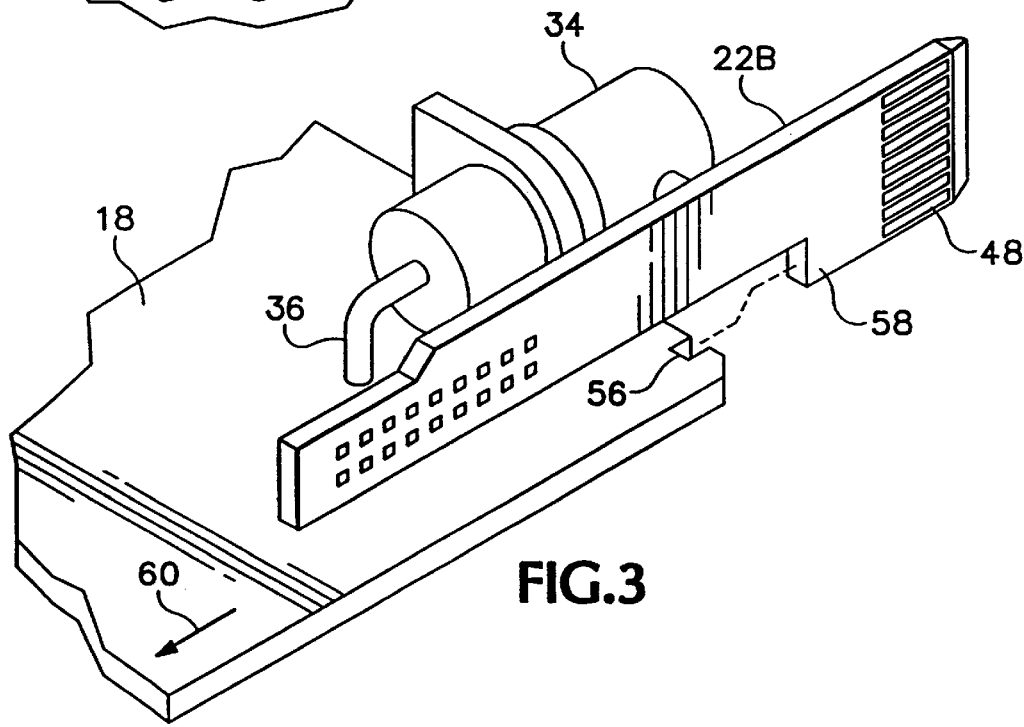
FIG. 3 is a partially exploded enlarged perspective view of a detail of the circuit board assembly at the other end of the connection edge.
Figure 4:
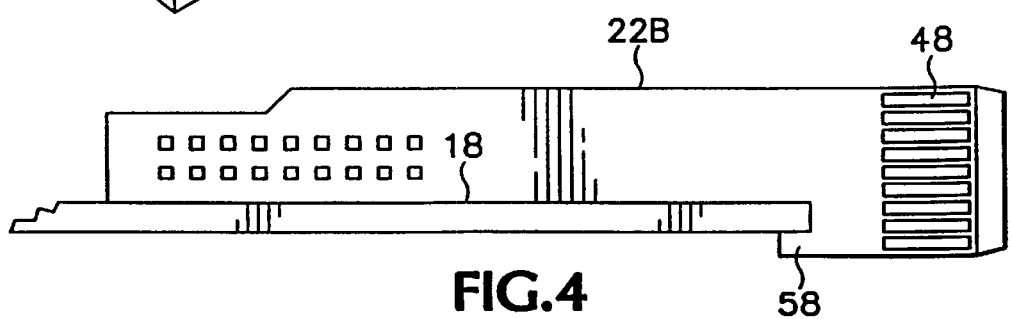
FIG. 4 is a side elevation of the detail shown in FIG. 3.

FIG. 1 illustrates a frame having two opposite side walls 10 (only one of which is shown) each provided with five horizontal guide channels 14 for receiving respective longitudinal edges of printed circuit boards 18 (only one of which is shown). Each circuit board 18 is part of a circuit board assembly 20 including the circuit board 18 (the main circuit board) and two auxiliary circuit boards 22A, 22B. The frame has a rear wall or bulkhead 26 formed with five rows of circular holes 28. A male/female BNC feed through 30 is mounted in each hole 28 with the male portion of the feed through presented towards the interior of the frame and the female portion presented towards the exterior, for receiving a BNC plug attached to a cable.

Several BNC receptacles 34 are attached to the main circuit board 18 on the upper side 29 thereof. Each BNC receptacle has a signal lead 36 which is connected through conductor traces (not shown) of the circuit board. When the circuit board assembly 20 is inserted in the frame, the BNC receptacles 34 of the main circuit board engage respective feed throughs 30 on the bulkhead, providing a uniform characteristic impedance path from the circuit board to the female portion of the feed through.

Two PCI card edge connector receptacles 38A, 38B are firmly attached to the bulkhead 26. The PCI receptacles 38A, 38B are vertically oriented and are positioned so that the BNC feed throughs 30 are between the two PCI receptacles 38A, 38B. As is conventional, each PCI receptacle 38A, 38B includes a housing 40 which is made of electrically insulating material and defines a slot 44 for receiving a connection edge of an auxiliary board. Sixty contacts (not shown) are mounted in the housing and arranged in one group of 11 contacts and one group of 49 contacts spaced apart by an alignment feature of the housing.

The two auxiliary circuit boards 22A, 22B are attached to the main circuit board 18 adjacent the longitudinal edges respectively. Each auxiliary circuit board 22A, 22B is perpendicular to the main board and extends parallel to the longitudinal edges and has a connection edge that extends beyond the connection edge of the main board approximately as far as the BNC receptacles. The auxiliary board is provided adjacent its connection edge with contact strips 48 of width and spacing for engagement with the contacts of a PCI receptacle. The contact strips are electrically connected to connector runs on the main board through conductive leads 52 that are soldered both to the auxiliary board and to the main board and thus serve to stabilize the auxiliary board relative to the main board. Further, the main board is formed with a notch 56 into which a projection 58 of the auxiliary board extends so that the main board supports the auxiliary board against movement in the direction of the arrow 60.

The auxiliary boards 22A, 22B are positioned relative to the main board 18 and the PCI receptacles 38A, 38B are positioned relative to the guide channels 14 so that when the circuit board assembly 20 is placed in the frame, with the edges of the main board 18 in the channels 14, the BNC receptacles 34 on the main board are aligned with the feed throughs 30 in one row of holes 28 and the connection edges of the auxiliary boards 22A, 22B are aligned with the slots of the PCI receptacles 38A, 38B respectively. When the circuit board assembly is pushed home to the rear of the frame, the BNC receptacles 34 engage the feed throughs 30 and the connection edges of the auxiliary boards enter the slots of the PCI receptacles. Electrical contact is made between the contact strips of the auxiliary board 22A and nine of the contacts of the PCI receptacle 38A. The auxiliary board 22B engages the PCI receptacle 38B in analogous manner. Consequently, the auxiliary boards and the mating PCI receptacles provide edge connection capacity for 18 additional connections to the main board, and may be used to provide control signals and power to the electronic components on the main board.

The guide channels 14 are positioned so that the alignment features of the housing 40 do not obstruct the auxiliary boards. When five circuit board assemblies 20 are installed in the frame, each with two auxiliary boards 22A, 22B received in the slots of the PCI receptacles 38A, 38B respectively, one auxiliary board 22A, for example, makes connection to 9 of the 11 contacts in the smaller group in the receptacle 38A and the other four auxiliary boards 22A make connection with 36 of the 49 contacts in the larger group in the receptacle 38 A, as explained in greater detail in copending Application Ser. No. 09/790309.

Whether the auxiliary boards 22 engage the PCI receptacles 38 before, simultaneously with, or after the BNC receptacles 34 engage the BNC feed throughs 30 is determined by the relative position of the connection edge of the auxiliary board and the BNC receptacles 34 and depends on the electrical requirements of the equipment.

It will be appreciated that the invention is not restricted to the particular embodiment that has been described, and that variations may be made therein without departing from the scope of the invention as defined in the appended claims and equivalents thereof. Unless the context indicates otherwise, a reference in a claim to the number of instances of an element, be it a reference to one instance or more than one instance, requires at least the stated number of instances of the element but is not intended to exclude from the scope of the claim a structure or method having more instances of that element than stated.

What is claimed is:

1. Electronic equipment comprising:

a frame including a wall and first connectors attached to the wall of the frame, a main board having a main board connection edge at which the main board is provided with second connectors for engaging the first connectors that are attached to the wall of the frame when the main board is advanced relative to the frame along a connection axis, an edge connector receptacle attached to the wall of the frame and defining a slot perpendicular to the connection axis and to the connection edge of the main board, and an auxiliary board attached to the main board and oriented perpendicular to the main board and parallel to the connection axis and having an auxiliary board connection edge perpendicular to the main board connection edge, the auxiliary board connection edge being positioned to enter the slot of the edge connector receptacle concurrently with engagement of the second connectors at the main board connection edge with the first connectors attached to the wall of the frame.

2. Electronic equipment according to claim 1, wherein the second connectors at the main board connection edge of the main board are BNC receptacles and the first connectors attached to the wall of the frame are BNC feed throughs.

3. Electronic equipment according to claim 1, wherein the main board has longitudinal edges perpendicular to the main board connection edge thereof and the frame includes longitudinal guides for receiving the longitudinal edges of the main board and guiding movement of the main board relative to the frame along the connection axis.

4. Electronic equipment according to claim 1, comprising multiple main boards each having a main board connection edge at which the main board is provided with second connectors for engaging first connectors that are attached to the wall of the frame when the main board is advanced relative to the frame along the connection axis, and an auxiliary board attached to each main board, the auxiliary boards being substantially coplanar, and wherein the slot of the edge connector receptacle has sufficient length to receive the connection edges of all the auxiliary boards.

5. Electronic equipment comprising:

a frame including a wall and first connectors attached to the wall of the frame, a main board having a main board connection edge at which the main board is provided with second connectors for engaging the first connectors that are attached to the wall of the frame when the main board is advanced relative to the frame along a connection axis, first and second edge connector receptacles attached to the wall of the frame and each defining a slot perpendicular to the connection axis and to the connection edge of the main board, the first connectors that are attached to the frame being located between the first and second edge connector receptacles, and first and second auxiliary boards attached to the main board and each oriented perpendicular to the main board and parallel to the connection axis and having an auxiliary board connection edge perpendicular to the main board connection edge each auxiliary board connection, the edge of first and second auxiliary boards being positioned to enter the slots of the first and second edge second connector receptacles respectively, concurrently with engagement of the connectors at the main board connection edge with the first connectors attached to the wall of the frame.

6. Electronic equipment according to claim 5, wherein the second connectors of the main board are between the two auxiliary boards.

7. Electronic equipment according to claim 5, wherein the second connectors at the main board connection edge of the main board are BNC receptacles and the first connectors attached to the wall of the frame are BNC feed throughs.

* * * * *

UNITED STATES PATENT AND TRADEMARK OFFICE
CERTIFICATE OF CORRECTION

PATENT NO.    : 6,568,944 B1
DATED         : May 27, 2003
INVENTOR(S)   : Charles S. Meyer, Robert W. Hudelson and Scott A. Matheson It is certified that error appears in the above-identified patent and that said Letters Patent is hereby corrected as shown below:

Column 5,
Line 14, a comma should be inserted after "edge"
Line 16, ", the edge of" should be deleted and replaced with -- edge of the --

Column 6,
Line 3, -- second -- should be inserted before "connectors"

Signed and Sealed this

Ninth Day of September, 2003

JAMES E. ROGAN
*Director of the United States Patent and Trademark Office*